United States Patent
Bazarjani et al.

(10) Patent No.: US 7,929,714 B2
(45) Date of Patent: Apr. 19, 2011

(54) INTEGRATED AUDIO CODEC WITH SILICON AUDIO TRANSDUCER

(75) Inventors: Seyfollah Bazarjani, San Diego, CA (US); Louis D. Oliveira, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 503 days.

(21) Appl. No.: 10/916,929

(22) Filed: Aug. 11, 2004

(65) Prior Publication Data

US 2006/0034472 A1 Feb. 16, 2006

(51) Int. Cl.
| | |
|---|---|
| H04R 3/00 | (2006.01) |
| H04R 25/00 | (2006.01) |
| H03G 3/00 | (2006.01) |
| H03G 7/00 | (2006.01) |
| H05K 1/14 | (2006.01) |
| H01L 23/02 | (2006.01) |
| H01L 23/34 | (2006.01) |
| H01L 23/04 | (2006.01) |
| H01L 23/48 | (2006.01) |

(52) U.S. Cl. ........ 381/111; 381/174; 381/175; 381/104; 381/106; 381/122; 381/322; 361/736; 361/737; 361/792; 361/793; 361/794; 361/795; 257/777; 257/686; 257/723; 257/730

(58) Field of Classification Search .......... 381/111, 381/174, 175, 322, 104, 106; 367/181; 361/736, 361/737, 792–795; 257/723–730, 686, 777, 257/787–790

See application file for complete search history.

(56) References Cited

U.S. PATENT DOCUMENTS

| | | | | |
|---|---|---|---|---|
| 4,533,795 | A | * | 8/1985 | Baumhauer et al. .......... 381/174 |
| 4,678,093 | A | * | 7/1987 | Allen ............................ 215/11.1 |
| 5,051,799 | A | * | 9/1991 | Paul et al. ..................... 375/242 |
| 6,088,463 | A | * | 7/2000 | Rombach et al. ............. 381/174 |
| 6,240,151 | B1 | * | 5/2001 | Ko ................................. 375/370 |
| 6,326,912 | B1 | | 12/2001 | Fujimori ....................... 341/143 |
| 6,522,762 | B1 | * | 2/2003 | Mullenborn et al. ......... 381/174 |

(Continued)

FOREIGN PATENT DOCUMENTS

EP 1292171 3/2003

(Continued)

OTHER PUBLICATIONS

AAPA, Figure 1.*

*Primary Examiner* — Devona E Faulk

(74) *Attorney, Agent, or Firm* — Knobbe Martens Olson & Bear, LLP

(57) ABSTRACT

An integrated audio transducer with associated signal processing electronics is disclosed. A silicon audio transducer, such as a MEMS microphone or speaker, can be integrated with audio processing electronics in a single package. The audio processing electronics can be configured using control signals. The audio processing electronics can provide a single line serial data interface and a single line control interface. The audio transducers can be integrated with associated processing electronics. A silicon microphone can be integrated with an Analog to Digital Converter (ADC). The ADC output can be a single line serial interface. The ADC can be configured using a single line serial control interface. A speaker may be integrated with a Digital to Analog Converter (DAC). Audio transducers can also be integrated with more complex processing electronics. Audio processing parameters such as gain, dynamic range, and filter characteristics may be configured using the serial interface.

33 Claims, 10 Drawing Sheets

U.S. PATENT DOCUMENTS

| | | | |
|---|---|---|---|
| 6,577,013 B1 * | 6/2003 | Glenn et al. | 257/777 |
| 6,722,206 B2 * | 4/2004 | Takada | 73/779 |
| 6,805,297 B2 * | 10/2004 | Okaue et al. | 235/492 |
| 2002/0054684 A1 | 5/2002 | Menzl | 381/23.1 |
| 2003/0235315 A1 * | 12/2003 | Reesor | 381/115 |
| 2004/0120540 A1 * | 6/2004 | Mullenborn et al. | 381/322 |

FOREIGN PATENT DOCUMENTS

EP      1292171 A2 *  3/2003

* cited by examiner

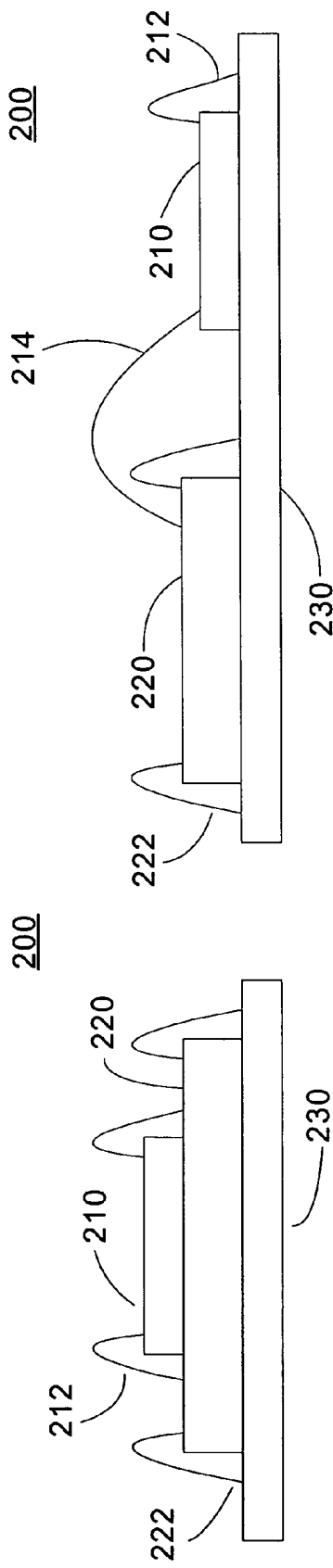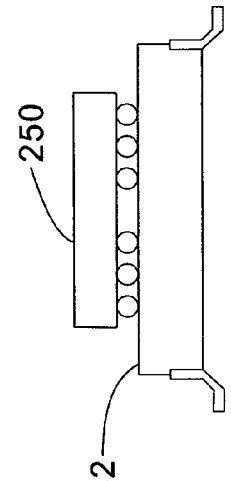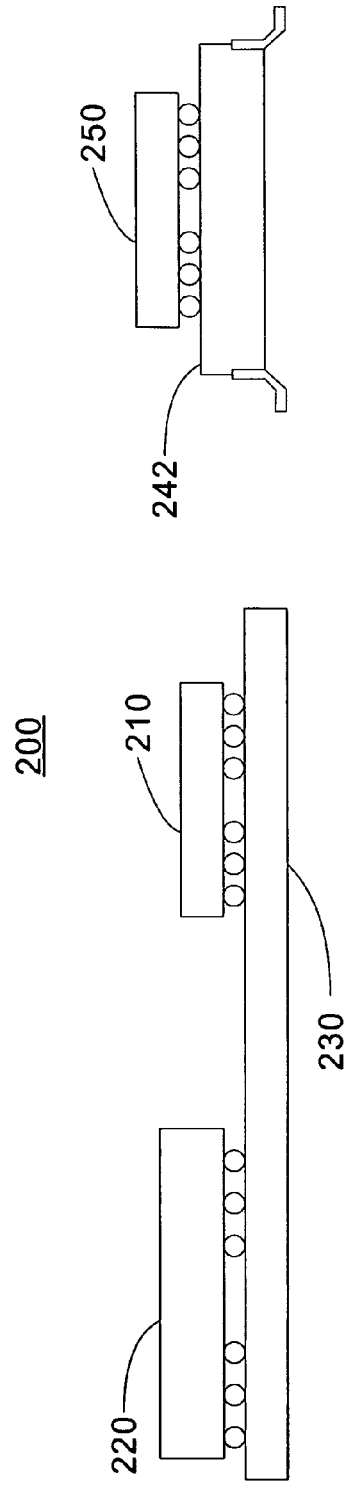

INTEGRATED AUDIO CODEC WITH SILICON AUDIO TRANSDUCER

BACKGROUND OF THE DISCLOSURE

The field of consumer electronics is continually striving to increase the features and functionality incorporated within a product while simultaneously striving to decrease the size and cost of the product. One example of a consumer product that is experiencing increased complexity and functionality while simultaneously experiencing decreased size and cost is a portable communication device, such as a wireless phone.

Consumers continually expect wireless phone designs to integrate additional features. However, consumers also expect wireless phone designs to continue to shrink in size and weight. Additionally, consumers are unwilling to accept features and functions unless the features and functions are available in phones whose costs that rival or are less than the costs of presently available phones.

As an example, early wireless phones that may have been the size of small handbags typically did not include any user display, did not include many user features other than the ability to make or receive a call, and may have had only marginal voice quality. Presently available wireless phones can typically fit in the palm of a user's hand. Additionally, presently available wireless phones typically include a bit mapped color display, numerous user features including electronic contact lists, calculators, user selectable ring tones, games, and cameras. Presently available wireless phones also typically have longer talk and standby times and provide a much improved communication quality over early phones. The presently available phones may have the ability to provide data communications as well as voice communications. Additionally, presently available phones typically cost the same or less than the original price for the early wireless phones.

Technological advances have contributed in part to the advancement of seemingly opposed design goals. Processors having increased complexity available at a lower cost have enabled the implementation of feature rich consumer devices in small, low cost packages. However, there continually exists the desire to provide additional features and improve performance while reducing size and cost.

BRIEF SUMMARY OF THE DISCLOSURE

An integrated audio transducer with associated signal processing electronics is disclosed. A silicon audio transducer, such as a MEMS microphone or speaker, can be integrated with audio processing electronics in a single package. The audio processing electronics can be configured using control signals. The audio processing electronics can provide a single line serial data interface and a single line control interface. The audio transducers can be integrated with associated processing electronics. A silicon microphone can be integrated with an Analog to Digital Converter (ADC). The ADC output can be a single line serial interface. The ADC can be configured using a single line serial control interface. A speaker may be integrated with a Digital to Analog Converter (DAC). The DAC may be configured with a single line serial data input interface and may also be configured with a single line control interface. Audio transducers can also be integrated with more complex processing electronics. Audio processing parameters such as gain, dynamic range, and filter characteristics may be configured using the serial interface.

One aspect of the disclosure includes a transducer system comprising a transducer and a transducer electronics die configured to provide one or more functions. The transducer electronics die is coupled to the transducer and implemented within the same package as the transducer.

In another aspect, the disclosure includes a transducer system comprising an integrated circuit carrier, a transducer die having at least one transducer and mounted to the carrier, and a transducer electronics die coupled to the transducer and mounted to the carrier. The transducer electronics is configured to provide a digital transducer interface.

In yet another aspect, the disclosure includes a transducer system comprising an integrated circuit carrier, a transducer die having at least one transducer and mounted to the carrier, and a transducer electronics die coupled to the transducer and mounted to the carrier. The transducer electronics is configured to provide a digital transducer interface comprising a one bit serial data interface, a one bit serial control interface, and a clock input.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

FIGS. 2A-2F are functional block diagrams of integrated silicon audio transducer and electronic processor package implementations.

DETAILED DESCRIPTION OF THE DISCLOSURE

An audio transducer integrated with relevant portions of a Coder/Decoder (CODEC) is disclosed. The integrated transducer with a coder or decoder allows improved performance by interfacing the associated coder or decoder signals to the transducer in a single package. Various aspects of the integration of the transducer with the associated coder or decoder and features implemented within the coders or decoders can advantageously increase system performance while maintaining a minimal size and minimal cost.

For example, an input audio transducer, such as a microphone, can be implemented as a Micro Electro Mechanical System (MEMS) microphone. The MEMS microphone can be implemented in the same package as a coder. The coder can include an amplifier configured to receive and amplify the signal from the MEMS microphone, an Analog to Digital Converter (ADC) to convert an analog transducer signal to a digital representation, and other signal processing blocks.

Similarly, an output audio transducer, such as a speaker, can be implemented as a MEMS speaker. The MEMS speaker can be implemented in the same package as a decoder. The decoder can include signal processing blocks configured to receive, for example, digital signals from a baseband processing circuit. The signal processing block can be configured to process the received data to produce digital representations of audio output. The decoder can also include a Digital to Analog Converter (DAC) configured to receive digital representations of audio output and convert them to analog representations. The analog output of the DAC may be coupled to an amplifier that amplifies the analog signal and drives the MEMS speaker.

Figure 1:
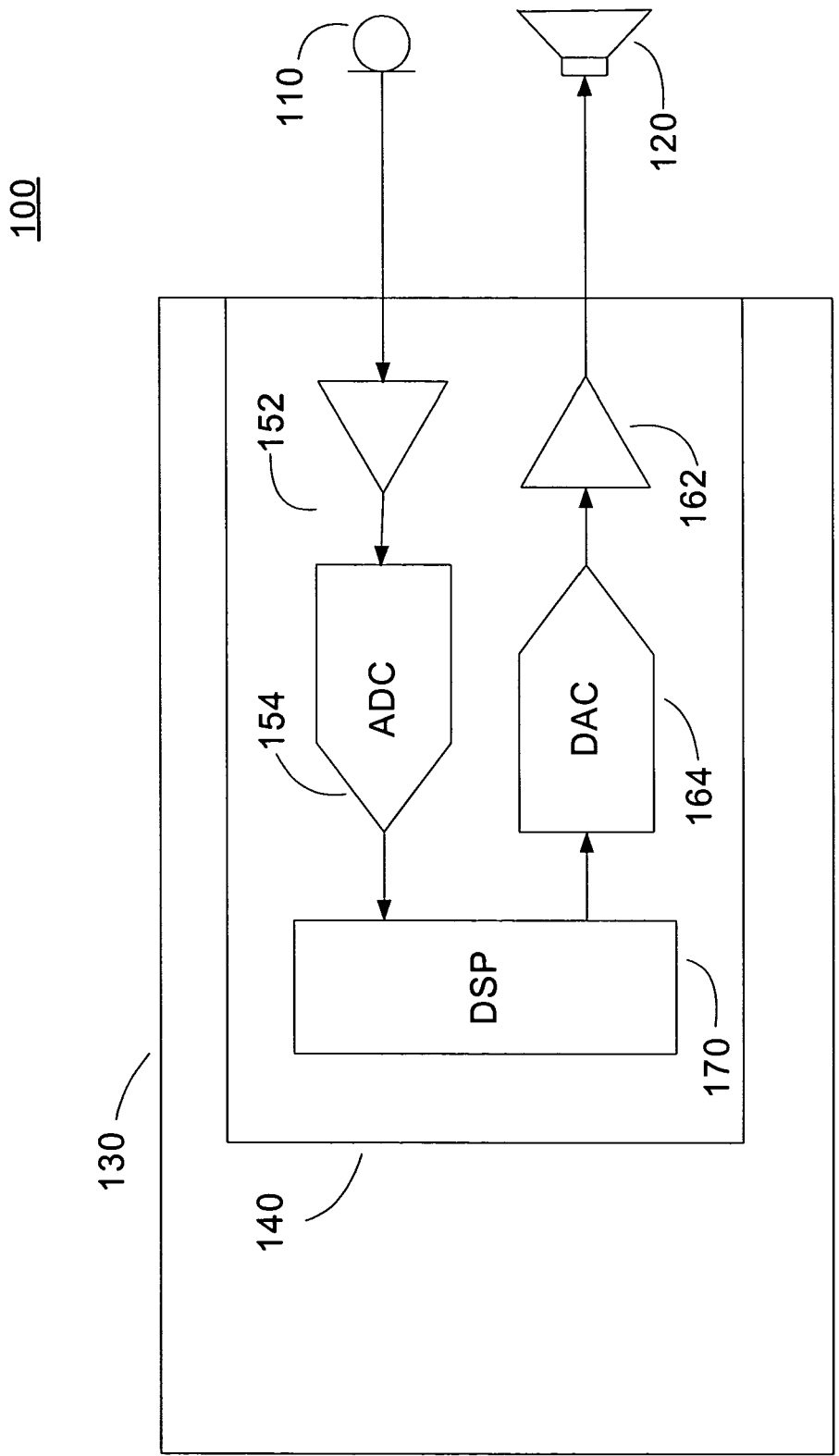
FIG. 1 is a functional block diagram of a prior art audio transducer and electronic processor system.

FIG. 1 is a functional block diagram of a prior art audio transducer and electronic processor system 100. The system 100 includes an input audio transducer, which can be a microphone 110 and an output audio transducer, which may be a speaker 120 such as an earphone speaker. The microphone 110 and speaker 120 are analog devices that interface with an audio processor 130. In one embodiment, the audio processor 130 can be a baseband processor Integrated Circuit (IC) of a wireless phone.

The audio processor 130 can include a CODEC 140 for interfacing with the audio transducers. The CODEC 140, as the name implies, can be configured to perform audio coder and decoder functions. The coder portion of the CODEC 140 can include an analog input amplifier 152 that is configured to receive the analog audio signal from the microphone 110. The output of the input amplifier 152 is converted to a digital representation of the signal in the ADC 154. The output of the ADC 154 can be coupled to, for example, a Digital Signal Processor (DSP) 170 where additional signal processing may occur. For example, the DSP 170 may compress the input signal or otherwise code the input signal for transmission to a remote location. For example, the DSP 170 may perform noise suppression, voice recognition, or may perform A-law or μ-law audio compression. The DSP 170 may be common to the coder and decoder portions of the CODEC 140.

The decoder portion of the CODEC 140 can receive signals from another device, sub-system, or a remote device at a remote location (not shown). The DSP 170 may operate on signals received from a remote location. The DSP 170 can, for example, decompress signals intended to be output by the system 100. The decompressed signals may be coupled from the DSP 170 to a DAC 164 where the digital signal representation is converted to an analog signal representation. The analog signal can be coupled to an output amplifier 162 that is configured to amplify the output signal and drive the speaker 120 with the amplified signal. The speaker 120 operates as an audio transducer to convert the electrical signal to an audible signal.

The microphone 110 is typically a device that generates a very low level analog signal. Additionally, the output of the microphone 110 may need to be routed to the input of the CODEC 140 within the audio processor 130. The low level analog signal microphone 110 signal is susceptible to noise, which degrades the signal quality.

Similarly, the speaker 120 is an analog device that receives an analog signal from the output amplifier 162. The output analog signal is typically much higher level than the input signal from the microphone 110. However, the output analog signal can be susceptible to noise. Because the speaker 120 produces an audio signal based on the analog signal, the audio signal quality can be degraded by noise.

Figure 2A:
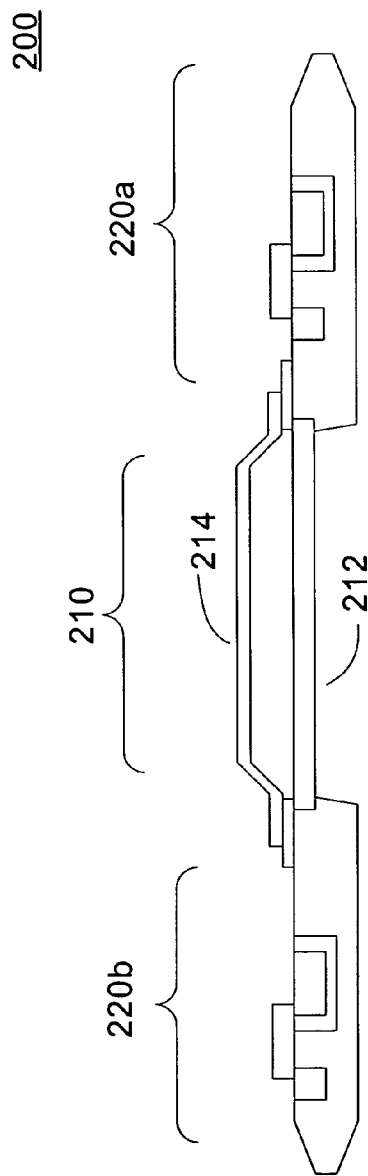

FIG. 2A is a cross section of an embodiment of a transducer system 200 having an integrated audio transducer with electronics. The transducer system 200 includes a MEMS audio transducer 210 manufactured on the same semiconductor substrate as transducer electronics, 220a and 220b. The MEMS audio transducer 210 can be, for example, a microphone. The MEMS audio transducer 210 can include a diaphragm electrode 212 separated from a bridge electrode 214. Transducer electronics 220a and 220b can be manufactured around the MEMS audio transducer 210. The transducer electronics 220a and 220b can include electronics manufactured on one or more layers of an integrated circuit. For example, the CODEC 140 of FIG. 1 may be manufactured on the same substrate as the MEMS audio transducer 210.

Figure 2B:
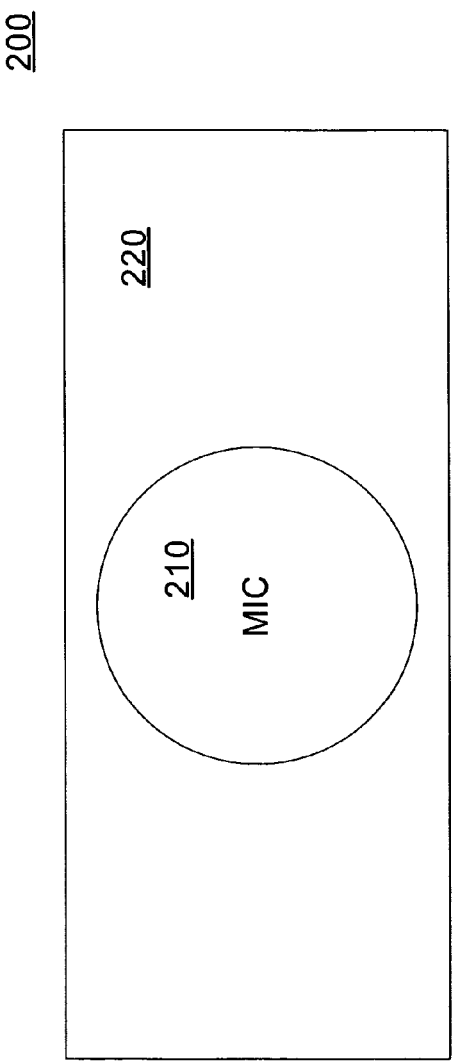

FIG. 2B is a functional diagram of a top view of the transducer system 200 embodiment of FIG. 2A. The MEMS audio transducer 210 is shown as a microphone manufactured in substantially the center of an integrated circuit. Transducer electronics 220 are shown as being manufactured on the portion of the substrate surrounding the MEMS audio transducer 210.

The integrated MEMS audio transducer system 200 of FIG. 2B can reduce the physical size of an audio transducer system. Additionally, the integrated system can improve the performance of the audio transducer system by substantially limiting the analog communication link between the transducer and the transducer electronics. However, the integrated audio transducer system 200 embodiment of FIG. 2B does little to reduce the cost of the system. In fact, the embodiment illustrated in FIG. 2B may cost more than a traditional transducer system.

Although the MEMS transducer 210 can be manufactured on a silicon substrate using a minimal number of fabrication process steps, the substrate area consumed by the MEMS transducer 210 may constitute a large portion of the total die area. Additionally, the die may need to be subjected to a number of process steps in order to manufacture the transducer electronics 220. For example, multiple insulator layers, metal layers, and ion implanted layers may need to be fabricated on the substrate in order to produce the transducer electronics 220.

Typically, an integrated circuit foundry prices fabrication costs based on the complexity of the processes and the die size. The complexity of the processes used in the transducer system 200 of FIG. 2B is determined largely by the transducer electronics 220. However, the size of the die is largely determined by the size of the MEMS transducer 210. Thus, although the MEMS transducer 210 uses relatively few simple process steps, the cost of manufacturing the transducer on the die is equivalent to the cost to manufacture the more complicated transducer electronics 220. Thus, integrating the transducer on to the electronics substrate using the embodiment of FIG. 2B may result in a large increase in the cost of the die.

FIG. 2C is a functional diagram of an elevation view of an embodiment of a single package multi-die integrated transducer system 200. In the embodiment of FIG. 2C the transducer 210 and transducer electronics 220 are manufactured on separate dies. The separate dies are then integrated on to a single package, for example, by mounting the dies on a single carrier 230. The carrier represents the package surface, support, or substrate on which a die, such as the transducer electronics 220 die, can be mounted.

In the embodiment of FIG. 2C, a die having transducer electronics 220 is bonded to the carrier 230. One or more wire bonds 222 can connect the transducer electronics 220 to connections on the carrier 230. The die for the transducer 210, which may be a MEMS transducer such as a MEMS microphone, can be bonded or otherwise mounted onto the die for the transducer electronics 220. One or more wire bonds 212 or interconnections can be used to coupled the signals between the transducer 210 and the transducer electronics 220. The stacked structure can then be encapsulated within a single package. The package may include an opening or some other structure to allow the sound waves to couple from outside the package to the transducer.

The stacked transducer system 200 provides many advantages over the conventional transducer system. The size of the transducer electronics 220 die is commensurate with the amount of electronics contained within the die. The transducer 210 die is similarly appropriately sized for the transducer. Thus, there is not a premium charged for die area that is used to manufacture a relatively simple but large transducer. The stacked transducer system 200 can also have a smaller die footprint, in part, because of the stacking of the transducer 210 and transducer electronics 220. The smaller die footprint can allow a smaller package size, which can also contribute to reducing the overall cost of the transducer system 200.

The unit area cost of manufacturing a MEMS transducer may be less than the unit area cost of manufacturing the transducer electronics 220 die. Thus, the total cost of manufacturing the two dies may be less than the cost of manufacturing a single die aggregating the transducer and electronics. The cost savings, in part, can be due to the decreased cost to manufacture the MEMS transducer die compared to the transducer electronics 220.

Moreover, the die used in production of the integrated transducer system 200 can be tested such that known good dies are used in the process, thereby substantially reducing the probability that the packaged transducer system 200 will be non-functional.

FIG. 2D is a functional diagram of an elevation view of another embodiment of a single package multi-die integrated transducer system 200. In the embodiment of FIG. 2D the transducer 210 and transducer electronics 220 are manufactured on separate dies and integrated on to a single package by mounting the dies side by side on a single carrier 230. The two dies can then be encapsulated in a single package to provide an integrated transducer system 200.

The transducer electronics 220 die can be mounted to the carrier and one or more bond wires 222 or connections can be used to couple signals to and from the die to the carrier 230. Similarly, the transducer 210 die can be mounted to the carrier 230 and one or more bond wires 212 may couple signals from the transducer 210 die to the carrier 230. Additionally, or in the alternative, one or more bond wires 214 or some other form of interconnection can be used to couple signals from the transducer 210 die to the transducer electronics 220 die without traversing a signal path on the carrier 230.

FIG. 2E is a functional diagram of an elevation view of still another embodiment of a single package multi-die integrated transducer system 200. In the embodiment of FIG. 2E, the transducer electronics 220 die and the transducer 210 die are flip chip mounted on the carrier 230. The flip chip mounted dies are then encapsulated within a single package. One or more traces, paths, or interconnections on the carrier can be used to couple signals between the dies. The flip chip mounting method allows the dies to be mounted to the carrier 230 without the need to perform multiple wire bonds.

Of course, other integration embodiments or combinations of the above embodiments are possible. For example, a first die may be wire bonded to carrier 230 and a second die may be flip chip mounted to the carrier 230. Additionally, although a single transducer electronics 220 die is disclosed in the embodiments of FIGS. 2C-2E, the transducer electronics 220 may be implemented as one or more dies. Similarly, although a single carrier 230 is disclosed in the embodiments of FIGS. 2C-2E, the carrier can include one or more carriers. Also, the order in which the dies are stacked can be modified from that shown in FIG. 2C. For example, the transducer 210 die may be bonded to the carrier 230 and the transducer electronics 220 die may be stacked on top of the transducer 210 die.

FIG. 2F is an alternative embodiment in which a transducer package 250 is mounted on a electronics package 242. The embodiment of FIG. 2F is a package-on-package mounting configuration. The transducer package 250 may include, for example, a MEMS transducer, or may be a conventional transducer.

In still other embodiments, the transducer is not limited to a MEMS transducer. For example, the transducer can be a conventional style transducer and the transducer electronics die may be mounted to and encapsulated within the packaging of the transducer. However, use of a silicon microphone, such as a MEMS microphone may be advantageous because a silicon microphone may have less long term drift than a conventional electret microphone.

Figure 3:
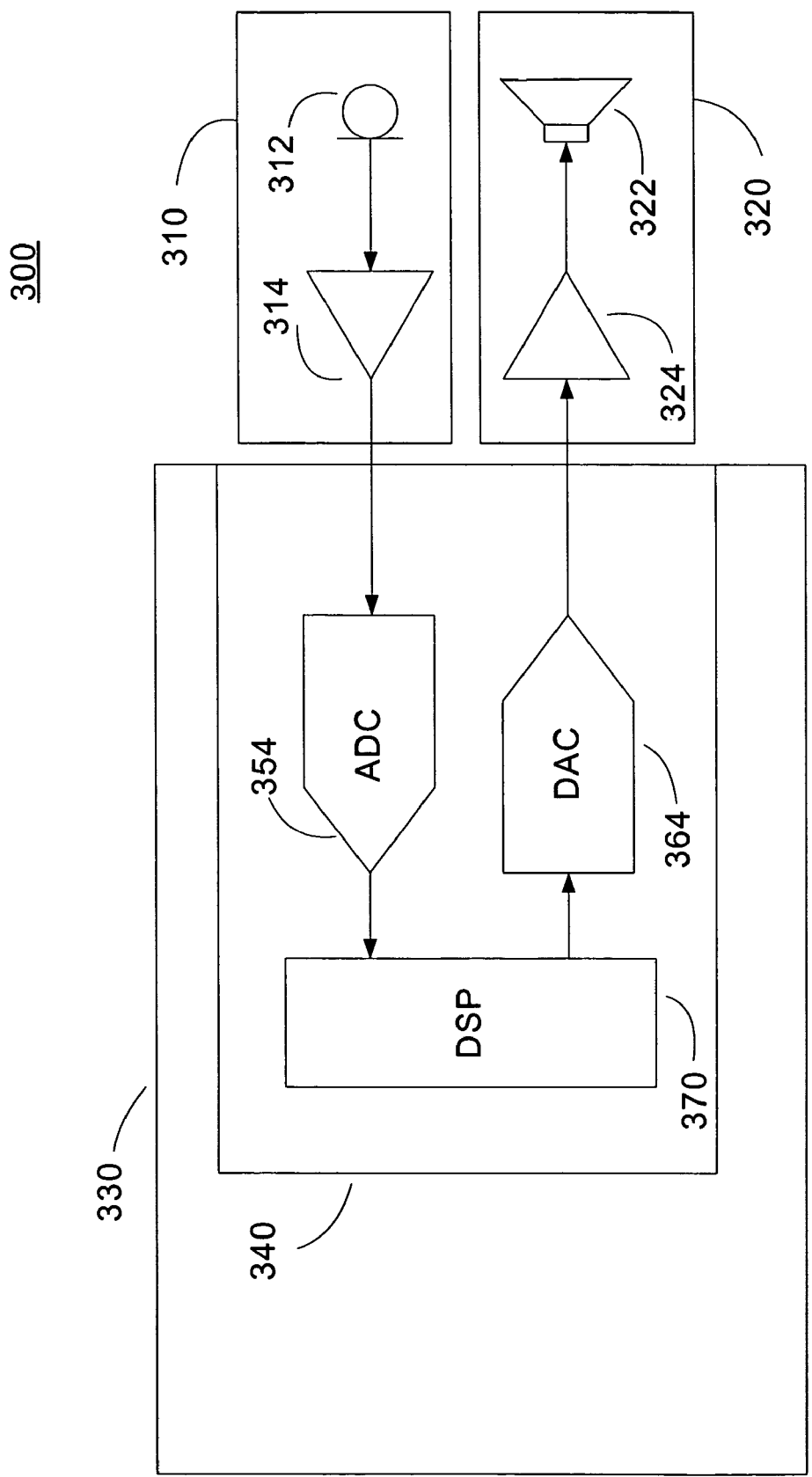
FIG. 3 is a functional block diagram of an embodiment of an integrated transducer and electronic processor system.

FIG. 3 is a functional block diagram of one embodiment of an audio transducer and electronic processor system 300. Integrated transducer systems, 310 and 320, are coupled to a simplified audio processor 330.

An input transducer system 310 can include a microphone 312 and amplifier 314 integrated within a single package, for example, as shown in the embodiments of FIGS. 2A-2E. The microphone 312 can couple the electronic signal to the amplifier 314, where it is amplified before being communicated to the audio processor. Amplifying the audio signal in an amplifier 314 integrated with the transducer 312 generates a higher amplitude audio signal before it is coupled to the audio processor 330. The higher audio level coupled with the minimal path coupling the low level transducer output to the amplifier 314 input decreases the signal sensitivity to noise.

Similarly, an output transducer system 320 can include an amplifier 324 integrated with an output transducer, such as a speaker 322. The amplifier 324 can receive the output audio signal from the audio processor 330 and provide the signal directly to the integrated speaker 322. In one embodiment, the amplifier can be a filterless Class D amplifier and the input of the amplifier driven with a PWM interface or some other type of digital interface.

The remainder of the system 300 is similar to the system shown in FIG. 1. A CODEC 340 within an audio processor 330 interfaces with the input and output transducer systems 310 and 320. However, the CODEC 340 can be simplified because of the additional functions integrated in the transducer systems 310 and 320. The CODEC 340 can include an input ADC 354 configured to receive the amplified signal from the input transducer system 310. The output of the ADC 354 can be coupled to a DSP 370 for further processing. The DSP 370 can also couple an output signal to a DAC 364. The DAC 364 can convert the digital representation of the signal to an analog representation and coupled the signal to the output transducer system 320.

Figure 4:
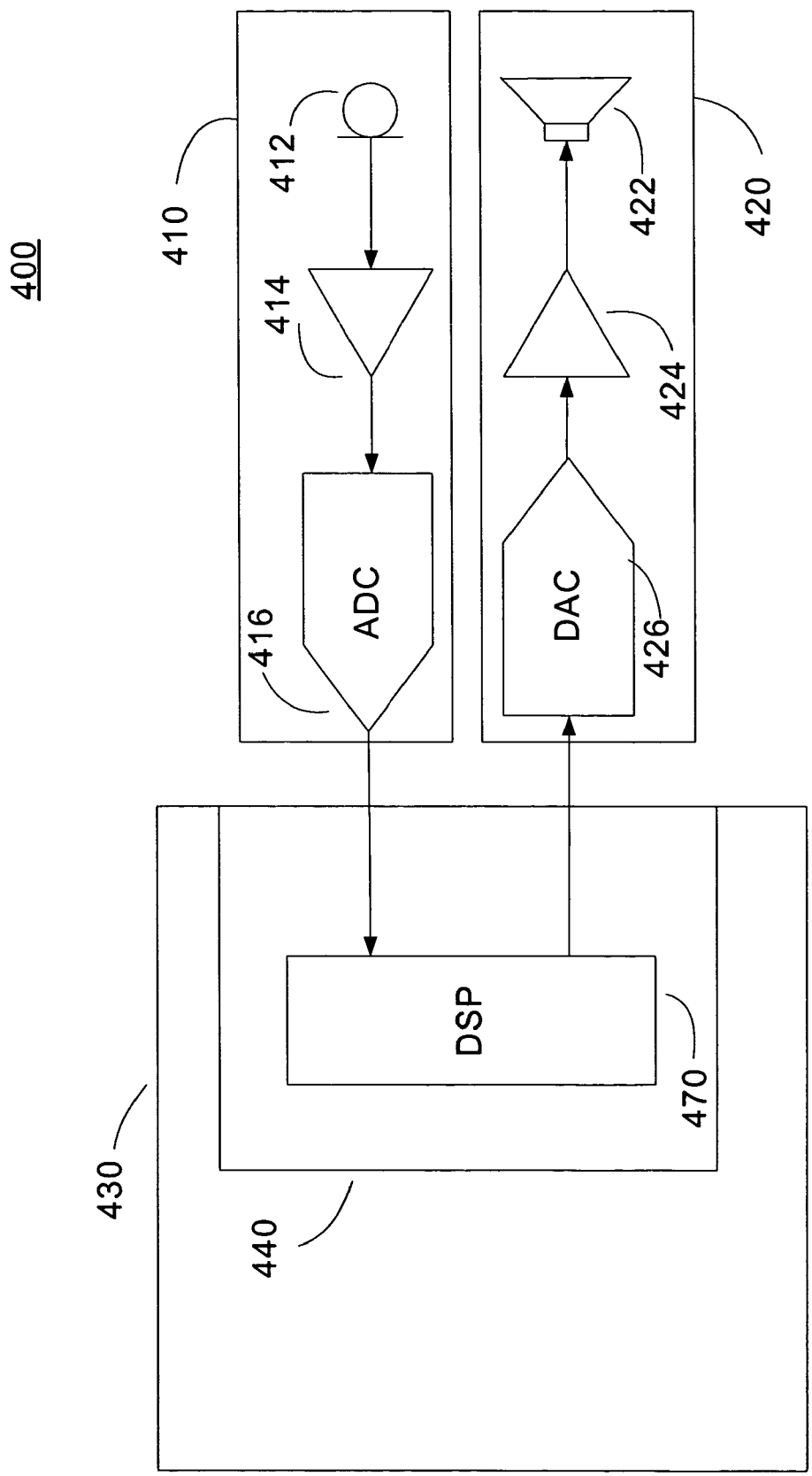
FIG. 4 is a functional block diagram of an embodiment of an integrated transducer and electronic processor system.

FIG. 4 shows a functional block diagram of another embodiment of an audio transducer and electronic processor system 400. In the system 400 embodiment of FIG. 4, additional functions are integrated in the input and output transducer systems, 410 and 420. The additional functions can further help to decrease the noise sensitivity of the transducer systems.

An input transducer system 410 can include a microphone 412, amplifier 414, and an ADC 416 integrated within a single package. As in the embodiment described in FIG. 3, the microphone 412 can receive audio signals and produce a corresponding electrical output signal. The signal can be coupled to the amplifier 414 that is mounted in the same package as the microphone 412. The amplifier 414 amplifies the signal and couples the amplified analog signal to an integrated ADC 416. Thus, the audio signal can be converted to its digital representation in the same package that houses the transducer. The digital output from the input transducer system 410 can then be coupled to a digital signal input on the audio processor 430. Generating a digital signal at the input transducer system 410 creates a signal that is more insensitive to noise than an analog signal.

In one embodiment, the output of the input transducer system 410 can be a one bit serial output. The serial data can be, for example, over sampled noise shaped data or can be baseband Pulse Code Modulated (PCM) data. The serial data is relatively robust in the presence of noise and is not affected by noise in the same manner as an analog signal.

An output transducer system 420 can include a DAC 426, amplifier 424, and speaker 422. The DAC 426 can be configured to receive a digital audio stream and convert it to an analog signal representation. In one embodiment, the DAC 426 is configured to receive a one bit serial data stream that can be the same format used to communicate the digitized input audio signal. The use of a digital input in the integrated output transducer system 420 allows a very low level signal to be transmitted to the transducer system 420 while simultaneously implementing good noise insensitivity. The analog output of the DAC 426 can be coupled to an amplifier 424 and, from the amplifier 424, to an output transducer such as a speaker 422.

The CODEC 440 and thus the audio processor 430 may be simplified due to the increased complexity implemented in the transducer systems 410 and 420. The input transducer system 410 includes some of the coder functions and the output transducer system 420 includes some of the decoder functions. The CODEC 440 can include a DSP 470 that communicates with the digital interfaces of the transducer systems 410 and 420.

Figure 5:
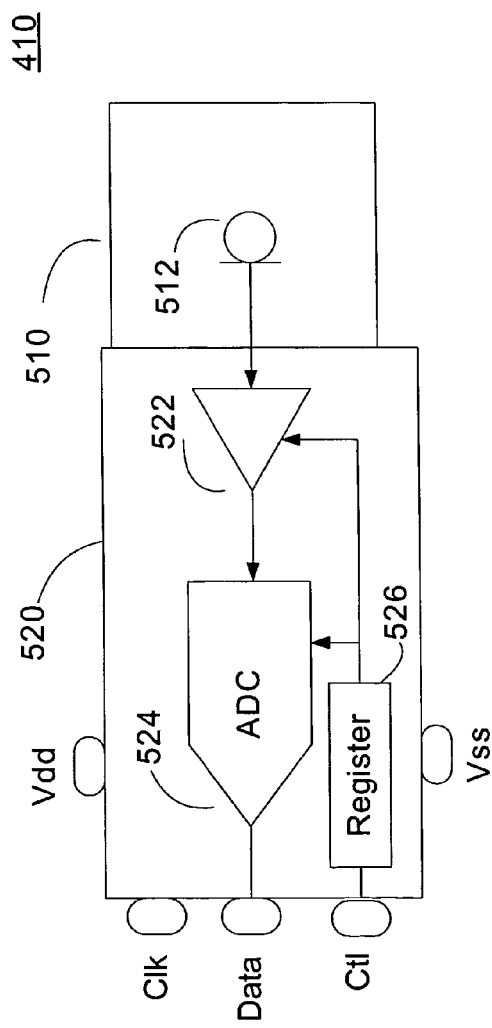
FIG. 5 is a functional block diagram of an embodiment of an integrated microphone having serial control and data.

FIG. 5 is a functional block diagram of an embodiment of an audio transducer system 410 such as the input transducer system of FIG. 4. The transducer system 410 embodiment includes a transducer die 510 having a microphone 512. As described earlier, the transducer die 510 may be a silicon die having a MEMS microphone 512 manufactured on it.

The transducer system 410 can also include a transducer electronics die 520. In some embodiments, the transducer die 510 and the transducer electronics die 520 may be the same semiconductor die. In other embodiments, the transducer die 510 and the transducer electronics die 520 may be separate dies within a single package. Various packaging embodiments are shown and described in conjunction with FIGS. 2A-2E.

The transducer electronics die 520 can include some or all coder functions. In the embodiment shown in FIG. 5, the transducer electronics die 520 includes an amplifier 522 configured to receive the electrical signal from the microphone 512. The output of the amplifier 522 is coupled to the input of an ADC 524.

The ADC 524 converts the analog output of the amplifier 522 to a digital representation. The ADC 524 can, for example, convert the analog signal to a one bit serial data stream. The output data stream generated by the ADC 524 can represent the analog data in accordance with a predetermined communications protocol. The data protocol can be a standardized data protocol or can be dedicated protocol. A standardized data protocol can include the I2S serial data communication protocol.

The transducer electronics die 520 can also include one or more control and clock inputs configured to accept configuration and clock signals from an external source such as an audio processor, baseband processor, or DSP. In one embodiment, the transducer electronics die 520 includes a clock input configured to accept a clock signal for the ADC 524. The clock signal may be used, for example, to synchronize signal conversion and data output from the ADC 524. In another embodiment, the transducer electronics die 520 can include two distinct clock inputs. A first clock input can be used to clock the data output and a second clock input can be used to clock control data. Thus, the rate and timing of control data can be synchronized or independent of the rate and timing for the output data.

The transducer electronics die 520 can also include one or more control interface inputs. The control interface inputs can be used, for example, to configure one or more configurable parameters of the transducer electronics. The configurable parameters can include, but are not limited to, amplifier or ADC gain, ADC dynamic range, ADC reference voltage, and filter characteristics.

In one embodiment, the control interface can be a one bit serial control interface. The serial control interface can be coupled to a register 526 that is used to convert the serial control data to parallel data having a bit width that corresponds to a bit width of a device control input. For example, the register 526 can be used to convert a serial gain control value to a parallel eight bit gain value provided to the amplifier 522. The various configurable parameters can have different bit widths. Some control values can be single bit values, while others can be multiple bits wide. Thus, the transducer system 410 may have as few as five external connections. The pins can include power and ground pins for the active electronics, a one bit serial data pin, a one bit serial control pin, and a clock input to control the rate at which data is clocked out of the transducer system 410 or the rate that control data is clocked into the transducer system 410.

Although the transducer system 410 is shown with single ended connections within the transducer electronics die 520, some or all of the connections between the various elements may be differential. For example, the external interface from the microphone 512 to the input of the amplifier 522 can be a single ended connection. The connection between the output of the amplifier 522 to the ADC 524 can be differential. In other embodiments, the transducer electronics die 410 can implement a combination of single ended and differential connections.

Another embodiment of the transducer system 410 may include a plurality of microphones 512 integrated within the same package. The microphones may be aligned along substantially parallel axis or may be aligned along substantially different axis. For example, a first microphone may be aligned along a first axis and a second axis may be aligned along an axis that is substantially perpendicular to the axis of the first microphone. Multiple microphones can be arranged in an array to provide particular characteristics.

In one embodiment, two or more microphones can be aligned along different axis to provide stereo input or multi-channel input. Two or more microphones configured to provide multi-channel input can be advantageous, for example, by providing an improved signal to noise ratio for use in applications such as voice recognition. Multi-channel input using multiple microphones can also provide improved voice quality.

The plurality of microphones may each have corresponding transducer electronics or the plurality of microphones may share some or all transducer electronics elements. For example, two microphones can each be configured with a corresponding amplifier. However, both amplifiers can be coupled to the same ADC. A multiplexer can couple the two amplifier outputs to a single ADC input or an ADC having multiple inputs can be used to convert the amplified transducer signals. The ADC can, for example, provide the digital representations in a time multiplexed manner over a single bit data line.

Similarly, a transducer system may use a single control line input to control parameters for more than one transducer, such as a microphone. The gain and dynamic range may be set individually or may be set globally for all transducers on a single package.

An output transducer system may incorporate multiple speakers arranged in an array to provide, for example, stereo output or audio output having processed effects, such as 3D effects. The amplifiers used for the speakers can be, for example, Class D type amplifiers.

Figure 6:
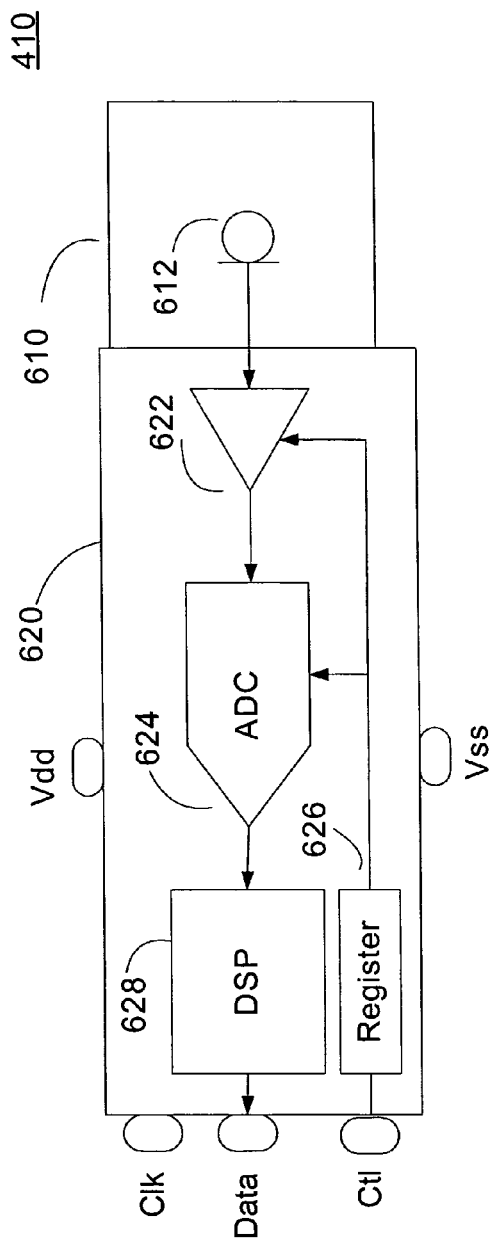
FIG. 6 is a functional block diagram of an embodiment of an integrated microphone having serial control and data.

Of course, the transducer electronics are not limited to amplifiers and digital converters. FIG. 6 is a functional block diagram of an embodiment of another integrated transducer system 410 having serial control and data. The integrated transducer system 410 includes a microphone 612 manufactured, for example, on a transducer die 610. The microphone 612 can interface with a transducer electronics die 620 configured to implement a greater portion of a coder than was implemented in the transducer electronics die 520 shown in FIG. 5.

The microphone 612 interfaces with an amplifier 622 which drives the input of an ADC 624. Thus far, the transducer system 410 can be the same as the system shown in FIG. 5. However, the transducer system 410 of FIG. 6 further includes a DSP 628 implemented at the output of the ADC 624. The DSP can provide some or all of the DSP functions performed in a CODEC within an audio processor. For example, the DSP 628 can be configured to perform such localized DSP functions such as audio or voice enhancements, wind rejection, or automatic level control. Having a DSP 628 implemented in the transducer system 410 can further unburden the processing required of an associated audio processor.

The output of the DSP 628 may be a single bit serial digital output. The use of a one bit serial output minimizes the number of pins that are required to interface with the transducer system.

As was the case with the transducer system 410 of FIG. 5, the transducer system 410 shown in FIG. 6 can couple the serial control line to a register 626 that can be used to convert the serial control data to parallel data having bit widths corresponding to those of the control inputs.

Additionally, the transducer electronics die 620 can implement one or more clocks. For example, the transducer electronics die 620 may implement a single clock input and configure a single clock for both the data and control interface. In other embodiments, the transducer electronics die 620 may implement two clocks, one configured to clock the data and another configured to clock the control interface.

Figure 7:
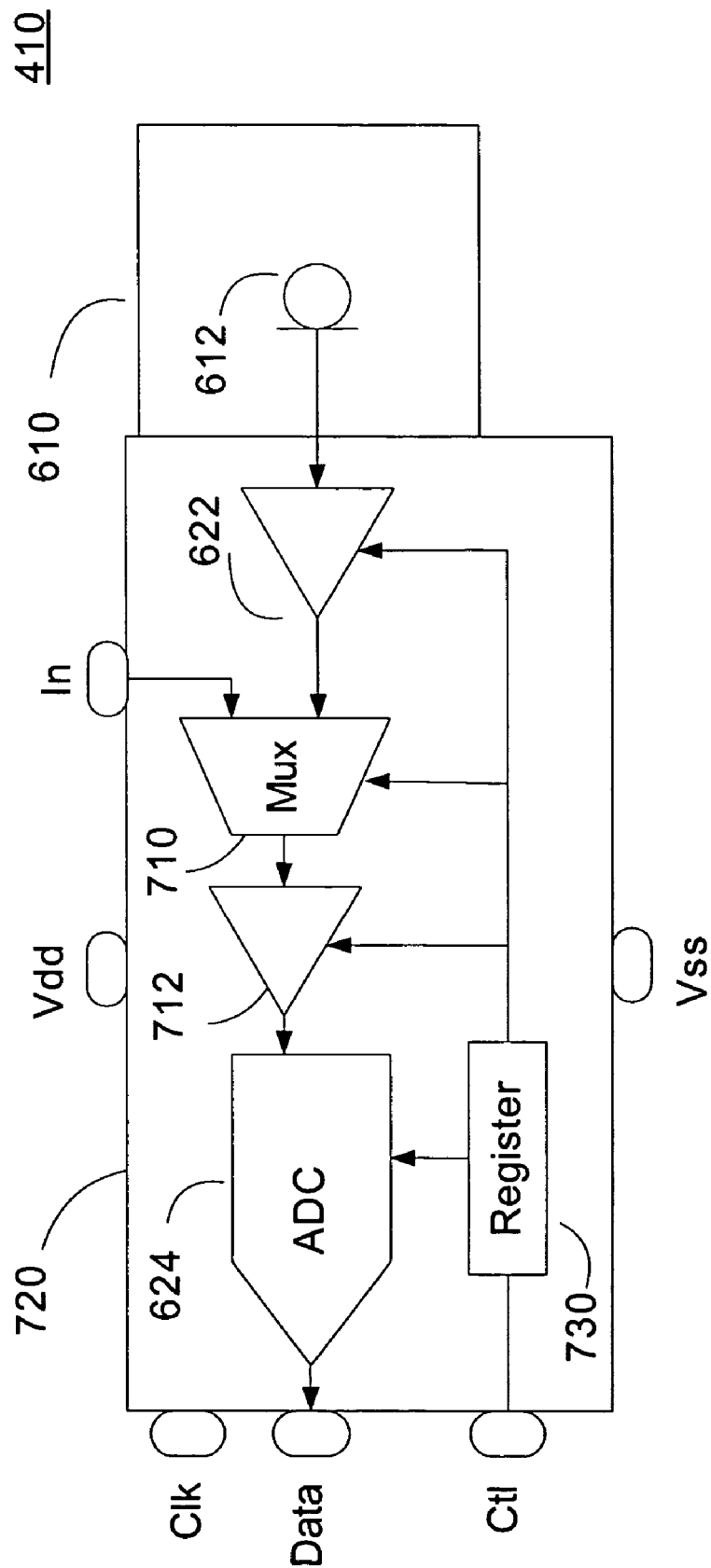
FIG. 7 is a functional block diagram of an embodiment of an integrated microphone having serial control and data.

FIG. 7 is a functional block diagram of another embodiment of an integrated transducer system 410. The integrated transducer system 410 embodiment of FIG. 7 is similar to the system shown in FIG. 5 with the addition of a multiplexer 710, second programmable gain amplifier 712, and an external signal input. The integrated transducer system 410 includes a microphone 612 manufactured, for example, on a transducer die 610.

The microphone 612 interfaces with a transducer electronics die 720. The transducer electronics die 720 includes a first programmable gain amplifier 622 which drives a first input of a multiplexer 710. A second input of the multiplexer is coupled to an external input on the transducer electronics die 720. The external input can be used, for example, to interface an external microphone to the system 410. The external input is shown as a single ended input but can also be implemented as a differential input. Typically, the signal provided to the external input is a band limited signal such as from an external microphone. The external microphone can be, for example, a microphone that is part of a car adaptor kit or microphone that is part of a headset. The external input can be coupled to a source that outputs analog signals that can be processed by the system 410. For example, the external source can be an FM radio chip, an audio processor or decoder, or a carkit.

The multiplexer 710 can be, for example, an analog multiplexer that is configured to switch between the internal amplifier 622 output and the external input. The output of the multiplexer 710 is coupled to an input of a second programmable gain amplifier 712. The output of the second programmable gain amplifier is coupled to the input of an ADC 624. The output of the ADC 624 can be a serial output that is coupled to an output interface of the transducer electronics die 720.

The transducer electronics die 720 can also include a serial control input. The control input is coupled to a register 730 and the contents of the register 730 can be used, for example, to configure one or more configurable parameters of the transducer electronics. The configurable parameters can include, for example, any combination of the amplifier 622 gain, the ADC 624 gain, the ADC 624 dynamic range, the ADC 624 reference voltage, and the multiplexer 710 selection.

As was the case with the other integrated transducer system 410 embodiments, the clock may be configured as a single clock that operates on output data as well as control data, or can be multiple clocks, such as a two clock embodiment having a first clock for the data and a second clock for the control data. Additionally, the transducer electronics die 720 can implement one or more interconnections between the various elements as single ended connections or differential interconnections.

Figure 8:
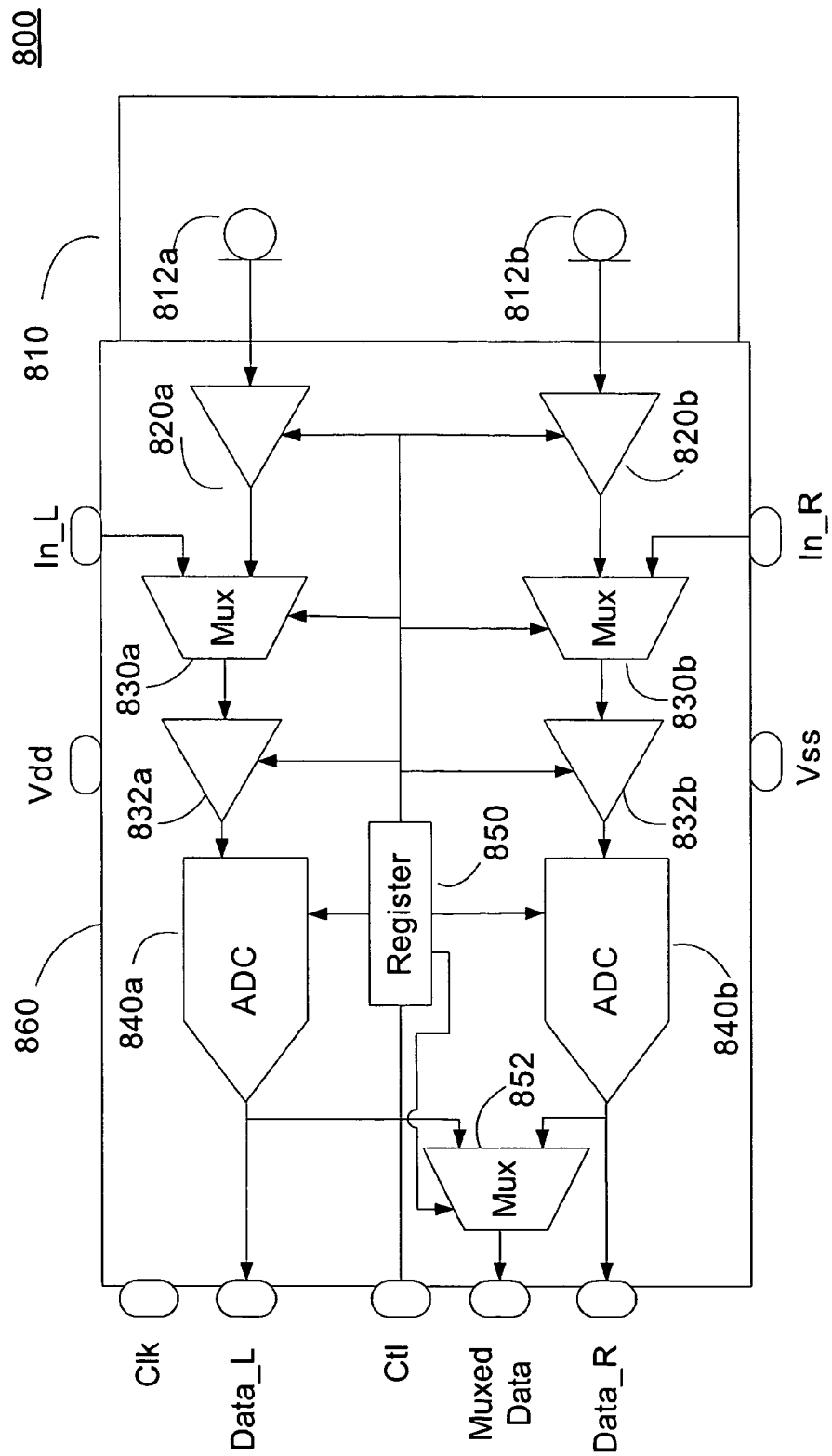
FIG. 8 is a functional block diagram of an embodiment of an integrated stereo microphone having serial control and data.

FIG. 8 is a functional block diagram of another embodiment of an integrated transducer system 800. As in previous embodiments, the integrated transducer system 800 includes a transducer die 810 coupled to a transducer electronics die 860.

The transducer die 810 can include multiple transducers 812a and 812b. The integrated transducer system 800 of FIG. 8 can be configured for stereo input. The transducer die 810 can include a first transducer 812a configured to be a left channel input transducer. The transducer die 810 can also include a second transducer 812b configured to be a right channel input transducer.

The respective outputs of the first and second transducers 812a-b can be coupled to left and right channel inputs of the transducer electronics die 860. The output of the first transducer 812a can be coupled to a first signal path on the transducer electronics die 860. The first signal path can begin at a first programmable gain amplifier 820a input. The output of the first programmable gain amplifier 820a can be coupled to a first multiplexer 830a. The first multiplexer 830a can be an analog multiplexer that is configured to select between the output of the first programmable gain amplifier 820*a* or an external left channel analog input signal. The output of the first multiplexer 830*a* can be coupled to a second programmable gain amplifier 832*a* whose output can be coupled to a first ADC 840*a* configured to convert the analog signal to a digital signal and output the signal as a serial data stream on a first signal output.

A second signal path on the transducer electronics die 860 can be configured as virtually a duplicate of the first signal path. The second transducer 812*b* is coupled to an input of a third programmable gain amplifier 820*b*. The output of the third programmable gain amplifier 820*b* is coupled to a first input of a second multiplexer 830*b*. The second multiplexer 830*b* can be an analog multiplexer configured to select between the output of the third programmable gain amplifier 820*b* or an external right channel analog input signal. The output of the second multiplexer 830*b* can be coupled to a fourth programmable gain amplifier 832*b* whose output can be coupled to a second ADC 840*b* configured to convert the analog signal to a digital signal and output the signal as a serial data stream on a second signal output.

An output multiplexer 852 can be used in addition to, or in place of, the individual left and right channel outputs. The output of the first ADC 840*a* can be coupled to a first input of the output multiplexer 852. The output of the second ADC 840*b* can be coupled to a second input of the output multiplexer 852. The output of the output multiplexer 852 can be coupled to a multiplexed data output. In one embodiment, the output multiplexer 852 may be configured to alternate left and right channel data output on successive clocks. In another embodiment, the output multiplexer 852 can be configured to clock the left channel and right channel data on different edges of a clock pulse. For example, the left channel data may be clocked out from the output multiplexer 852 on rising edges of a clock signal and the right channel data may be clocked out from the output multiplexer 852 on falling edges of the clock signal.

In the embodiment shown in FIG. 8, the output multiplexer 852 is implemented in addition to the independent left channel and right channel outputs. In another embodiment, the output multiplexer 852 and associated multiplexed data output may be omitted. In still another embodiment, the independent left and right channel outputs can be omitted and the multiplexed data output may be the sole output port.

A single serial control input can be configured to accept the control data and couple the control data to the appropriate location in a register 850. The register 850 contents can configure various configurable parameters of both the first and second signal paths. The register 850 can include one or more locations that are common to both the first and second signal paths. Additionally, the register 850 can include one or more locations that configure the first signal path independent of the second signal path.

Although the integrated transducer system 800 embodiment of FIG. 8 includes independent first and second signal paths, other embodiments may include multiple signal paths that share one or more components. For example, an alternative embodiment can include an ADC that is time multiplexed between multiple signal paths. In still another embodiment, the multiplexer may be configured to select between the internal or external signals as pairs. Still other embodiments having shared signal elements can be imagined.

As was the case with the other integrated transducer system embodiments, the clock may be configured as a single clock that operates on output data as well as control data, or can be multiple clocks, such as a two clock embodiment having a first clock for the data and a second clock for the control data.

The left and right channel inputs may be single ended or may be differential. Additionally, the transducer electronics die 860 can implement one or more interconnections between the various elements as single ended connections or differential interconnections.

Figure 9:
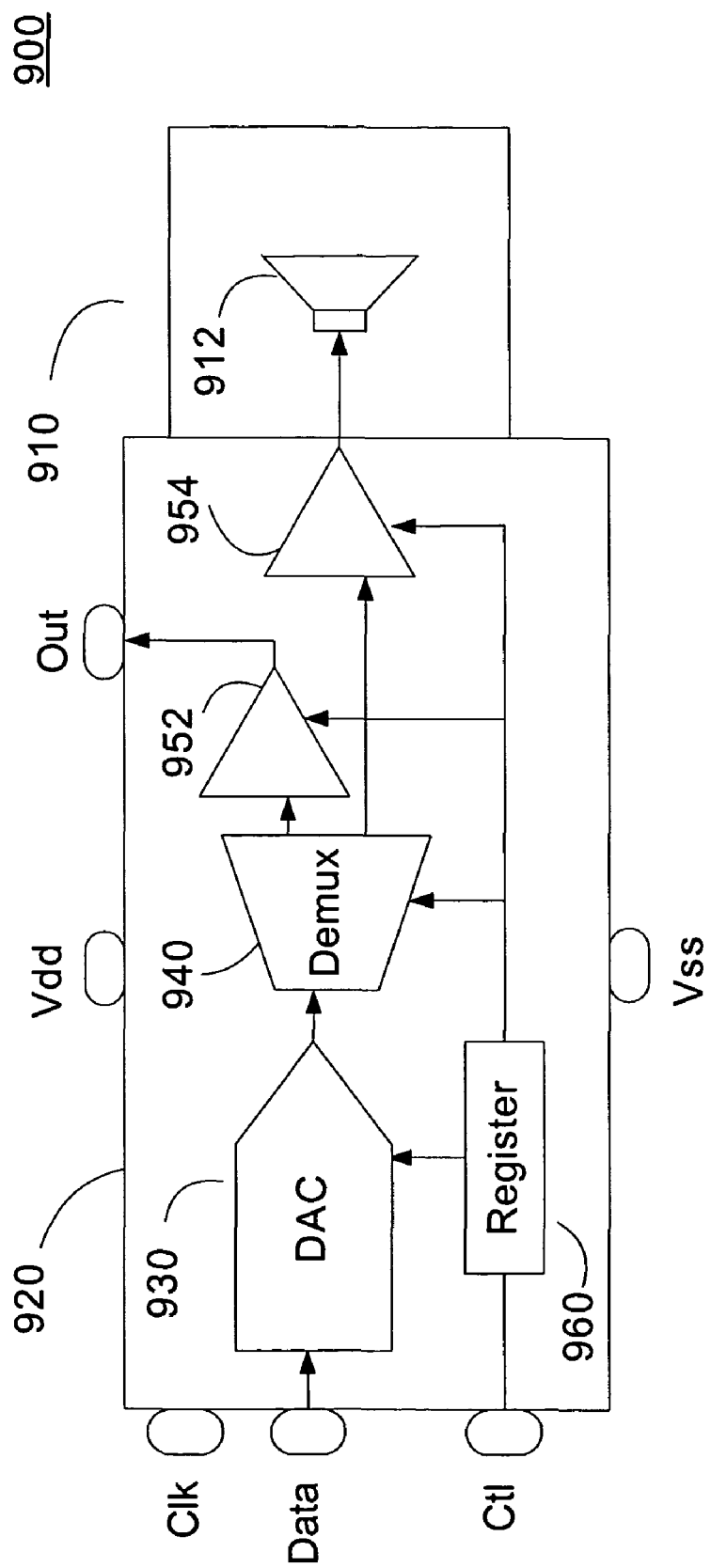
FIG. 9 is a functional block diagram of an integrated speaker with serial control and data.

FIG. 9 is another embodiment of an integrated transducer system 900 configured as an output transducer system. The integrated transducer system 900 includes a transducer electronics die 920 configured to provide a portion of decoder functions typically integrated within a CODEC. The output of the transducer electronics die 920 is coupled to a transducer die 910 having an output transducer, which may be, for example, a silicon speaker 912.

The transducer electronics die 920 can include a single line serial input configured to receive a serial digital audio stream. The serial input can be coupled to a DAC 930 configured to transform the serial data stream into an analog representation. The output of the DAC 930 can be coupled to an input of a demultiplexer 940 that is configured to selectively route the signal to one of two signal outputs based on a control value.

A first output of the demultiplexer 940 can be coupled to a first programmable gain amplifier 952. The output of the first programmable gain amplifier 952 can be coupled to an external signal output. The external signal output can be used to couple the signal to, for example, a carkit, headset speaker, audio visual receiver, audio processor, audio encoder, or some other external device. A second output of the demultiplexer 940 can be coupled to a second programmable gain amplifier 954. The output of the second programmable gain amplifier 954 can be coupled to the silicon speaker 912.

A single line serial control input can be coupled to a register 960. The contents of the register 960 can be used, for example, to configure one or more configurable parameters of the transducer electronics. One or more clock inputs can be configured to interface with one or more clocks. As discussed above, a single clock can be used for both the data and the control data. In another embodiment separate clocks can be used for the input data and the control data. The transducer electronics die 920 can be configured with one or more single ended interconnections or one or more differential connections. For example, the external output may be a differential output.

Figure 10:
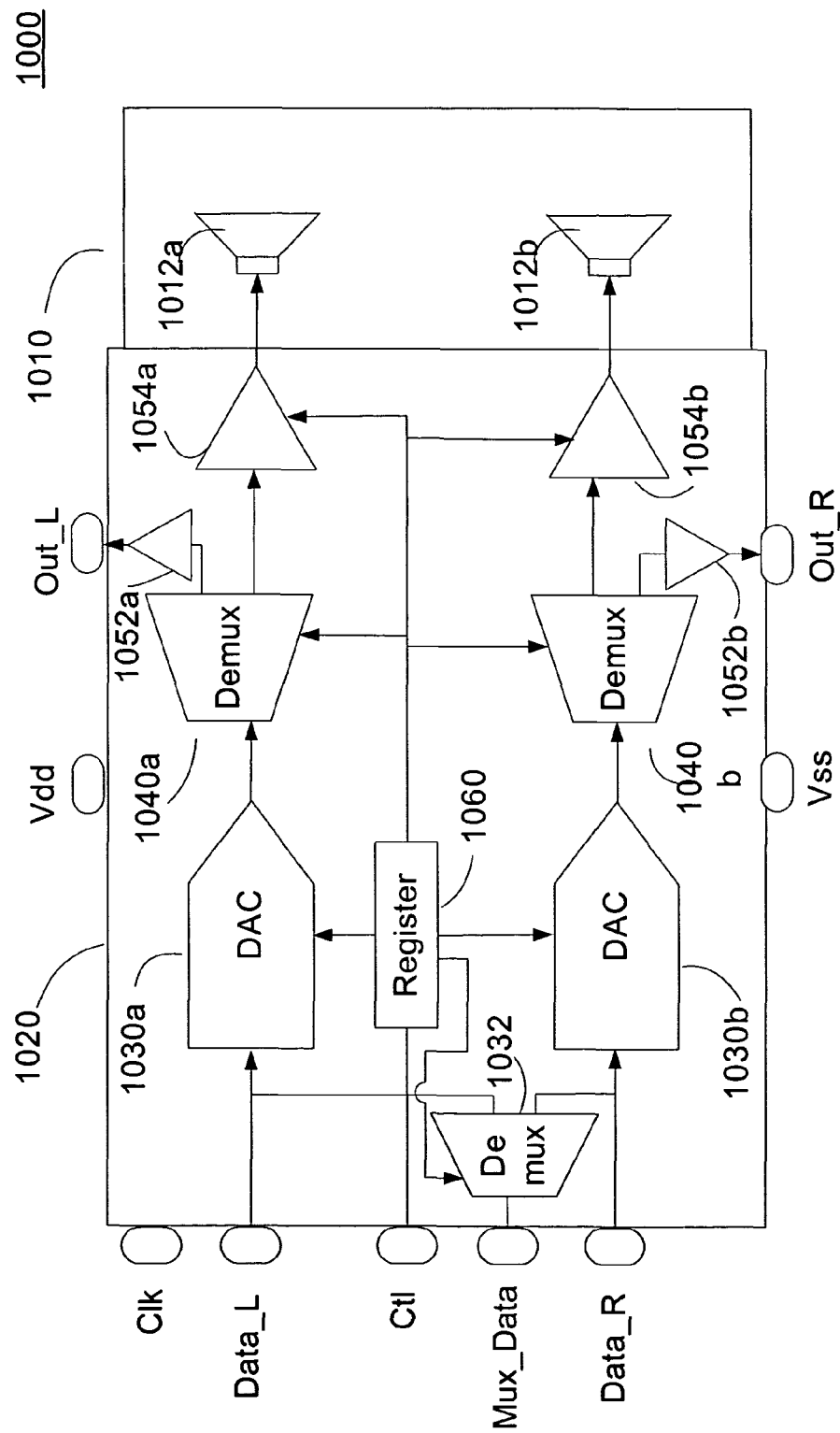
FIG. 10 is a functional block diagram of an integrated stereo speaker with serial control and data.

FIG. 10 is a functional block diagram of another embodiment of an integrated transducer system 1000 configured as an output transducer system. The embodiment shown in FIG. 10 is the functional complement to the input transducer system shown in FIG. 8. A transducer electronics die 1020 is coupled to a transducer die 1010 having stereo output transducers.

The transducer electronics die 1020 includes separate left and right channel data inputs, that each can be a single line serial input. The left channel serial data input can be coupled to an input of a first DAC 1030*a*. Similarly, the right channel serial data input can be coupled to an input of a second DAC 1030*b*.

The transducer electronics die 1020 can provide a single multiplexed data line in addition, or in place of, the separate left and right channel serial data inputs. The multiplexed data can be coupled to an input of an input data demultiplexer 1032. The input data demultiplexer 1032 can be configured to route the serial multiplexed data to the appropriate DAC, 1030*a* or 1030*b*, based on a clock signal. For example, the input data demultiplexer 1032 can route the input data to the first DAC 1030*a* on rising edges of a clock signal and can route signals to the second DAC 1030*b* on falling edges of the clock signal.

The output of the first DAC 1030a can be coupled to a first demultiplexer 1040a configured to selectively route the first DAC 1030a output to one of two outputs based on a control signal. A first output from the first demultiplexer 1040a can be coupled to a first programmable gain amplifier 1052a whose output can be coupled to an external left channel output. A second output from the first demultiplexer 1040a can be coupled to a second programmable gain amplifier 1054a whose output can be coupled to a first speaker 1012a in the transducer die 1010.

Similarly, the output of the second DAC 1030b can be coupled to a second demultiplexer 1040b configured to selectively route the second DAC 1030b output to one of two outputs based on a control signal. A first output from the second demultiplexer 1040b can be coupled to a third programmable gain amplifier 1052b whose output can be coupled to an external right channel output. A second output from the second demultiplexer 1040b can be coupled to a fourth programmable gain amplifier 1054b whose output can be coupled to a second speaker 1012b in the transducer die 1010.

A serial control input can be coupled to a register 1060. The contents of the register 1060 can be used, for example, to configure one or more configurable parameters of the transducer electronics.

One or more clock inputs can be configured to interface with one or more clocks. As discussed above, a single clock can be used for both the data and the control data. In another embodiment separate clocks can be used for the input data and the control data. The transducer electronics die 1020 can be configured with one or more single ended interconnections or one or more differential connections. For example, the right and left channel external outputs may be differential outputs.

A transducer and transducer electronics integrated within a single package has been disclosed. The transducer can be a discrete transducer, such as a conventional transducer, or can be a semiconductor transducer, such as a silicon MEMS transducer. The transducer and transducer electronics can be implemented within the same semiconductor die or the transducer and transducer electronics can be separate but share the same package.

The transducer can be implemented as a silicon transducer on a first die and the transducer electronics can be implemented on a second die separate from the first die. The two die can be implemented within the same package using a variety of techniques. Alternatively, a transducer electronics die may be mounted on a discrete transducer, such as a speaker. The transducer electronics are then integrated within the discrete transducer.

The transducer electronics can be analog or can have a mixture of analog and digital circuits. For example, the transducer electronics can include an amplifier, an amplifier and digital converter, or an amplifier, digital converter, and DSP.

The transducer electronics can be integrated with one or more transducers. One or more transducers can share the same transducer electronics or can share portions of the transducer electronics. Alternatively, each transducer has corresponding transducer electronics that are independent for the other transducers.

The above description of the disclosed embodiments is provided to enable any person skilled in the art to make or use the disclosure. Various modifications to these embodiments will be readily apparent to those skilled in the art, and the generic principles defined herein may be applied to other embodiments without departing from the scope of the disclosure. Thus, the disclosure is not intended to be limited to the embodiments shown herein but is to be accorded the widest scope consistent with the principles and novel features disclosed herein.

What is claimed is:

1. A transducer system comprising:
   an integrated circuit carrier;
   a transducer comprising a semiconductor die; and
   a transducer electronics die configured to provide one or more functions, coupled to the transducer, mounted on the integrated circuit carrier, and encapsulated within a package, the transducer electronics die comprising an amplifier in direct communication with the transducer, the transducer electronics die having transducer electronics configured to provide a digital transducer interface comprising a serial data interface, a serial control interface, and a clock input, wherein the serial control interface is configured to receive a control signal that selectively controls a gain of the amplifier, wherein the transducer electronics die further comprises a digital signal processor (DSP) in communication with the amplifier, and wherein the DSP is configured to implement a CODEC for compressing audio data from the transducer or wherein the DSP is configured to implement a CODEC for decompressing audio data being supplied to the transducer,
   wherein the transducer is implemented separate from and external to the transducer electronics die and encapsulated within the package; and
   wherein the semiconductor die is stack mounted on the transducer electronics die.

2. The transducer system of claim 1, wherein the semiconductor die comprises a MEMS transducer on a silicon die separate from the transducer electronics die.

3. The transducer system of claim 1, wherein at least one of the transducer electronics die and the semiconductor die is wire bonded to the carrier.

4. The transducer system of claim 1, wherein at least one of the transducer electronics die and the semiconductor die is flip chip bonded to the carrier.

5. The transducer system of claim 1, wherein the transducer electronics die comprises:
   an Analog to Digital Converter (ADC) configured to convert an output signal from the amplifier to a digital representation of the signal.

6. The transducer system of claim 5, wherein the ADC is further configured to provide a one bit serial data output.

7. The transducer system of claim 5, wherein the DSP is coupled to the output of the ADC and configured to process the ADC output data and provide a one bit serial data output.

8. The transducer system of claim 5, wherein the serial control interface is configured to receive a control signal that selectively controls an ADC dynamic range.

9. A transducer system comprising:
   an integrated circuit carrier;
   a transducer die having at least one transducer and mounted to the carrier, the transducer die being encapsulated within a package; and
   a transducer electronics die separate from the transducer die, coupled to the at least one transducer, mounted to the carrier, and encapsulated within the package, the transducer electronics die comprising an amplifier in communication with the transducer and transducer electronics configured to provide a digital transducer interface comprising a serial data interface, a serial control interface, and a clock input, wherein the serial control interface is configured to receive a control signal for the amplifier, wherein the transducer electronics die further comprises a digital signal processor (DSP) in communication with the amplifier, and wherein the DSP is configured to implement a CODEC for compressing audio data from the transducer or wherein the DSP is configured to implement a CODEC for decompressing audio data being supplied to the transducer.

10. The transducer system of claim 9, wherein the transducer comprises a microphone.

11. The transducer system of claim 9, wherein the transducer comprises a speaker.

12. The transducer system of claim 9, wherein the serial data interface comprises a one bit serial data interface.

13. The transducer system of claim 9, wherein the serial control interface comprises a one bit serial control interface configured to receive a serial control signal configured to selectively control an audio gain of the transducer electronics.

14. The transducer system of claim 9, wherein the transducer electronics comprises an Analog to Digital Converter (ADC) configured to convert a transducer output signal to a digital representation of the signal and wherein the serial control interface comprises a one bit serial control interface configured to receive a serial control signal configured to selectively control a dynamic range of the ADC.

15. The transducer system of claim 9, wherein the transducer electronics comprises an Digital to Analog Converter (DAC) configured to convert a digital signal to an analog transducer input signal.

16. A transducer system comprising:
an integrated circuit carrier;
a transducer die having at least one transducer and mounted to the carrier, the transducer die being encapsulated within a package; and
a transducer electronics die separate from the transducer die, having an amplifier in communication with the transducer and transducer electronics coupled to the at least one transducer, mounted to the carrier, and encapsulated within the package, the transducer electronics configured to provide a digital transducer interface, wherein the transducer electronics die further comprises a digital signal processor (DSP) in communication with the amplifier, and wherein the DSP is configured to implement a CODEC for compressing audio data from the transducer or wherein the DSP is configured to implement a CODEC for decompressing audio data being supplied to the transducer.

17. The transducer system of claim 16, wherein the transducer die comprises a plurality of microphones having outputs coupled to the transducer electronics.

18. The transducer system of claim 16, wherein the transducer die comprises a plurality of speakers having inputs coupled to the transducer electronics.

19. A transducer system comprising:
an integrated circuit carrier;
a transducer die having at least one transducer and mounted to the carrier, the transducer die being encapsulated within a package; and
a transducer electronics die separate from the transducer die, encapsulated within the package, and comprising:
means for amplifying a signal received from or supplied to the transducer;
means for providing a serial interface to the at least one transducer;
means for receiving a control serial control signal;
means for receiving a clock signal synchronized to the control signal; and
means for compressing audio data from the transducer or decompressing audio data being supplied to the transducer.

20. A transducer system comprising:
an integrated circuit carrier;
a transducer comprising a semiconductor die mounted on the integrated circuit carrier; and
a transducer electronics die configured to provide one or more functions, coupled to the transducer, and encapsulated within a package, the transducer electronics die comprising an amplifier in communication with the transducer, the transducer electronics die having transducer electronics configured to provide a digital transducer interface comprising a serial data interface, a serial control interface, and a clock input, wherein the transducer electronics die further comprises a digital signal processor (DSP) in communication with the amplifier, and wherein the DSP is configured to implement a CODEC for compressing audio data from the transducer or wherein the DSP is configured to implement a CODEC for decompressing audio data being supplied to the transducer,
wherein the transducer is implemented external to the transducer electronics die and encapsulated within the package; and
wherein the transducer electronics die is stack mounted on the semiconductor die.

21. The transducer system of claim 20, wherein the semiconductor die comprises a MEMS transducer on a silicon die separate from the transducer electronics die.

22. The transducer system of claim 20, wherein at least one of the transducer electronics die and the semiconductor die is wire bonded to the carrier.

23. The transducer system of claim 20, wherein at least one of the transducer electronics die and the semiconductor die is flip chip bonded to the carrier.

24. The transducer system of claim 20, wherein the transducer electronics die comprises:
an Analog to Digital Converter (ADC) configured to convert an output signal of the amplifier to a digital representation of the signal.

25. The transducer system of claim 24, wherein the ADC is further configured to provide a one bit serial data output.

26. The transducer system of claim 24, wherein the DSP is coupled to the output of the ADC and configured to process the ADC output data and provide a one bit serial data output.

27. The transducer system of claim 24, wherein the serial control interface is configured to receive a control signal that selectively controls a gain of the amplifier.

28. The transducer system of claim 24, wherein the serial control interface is configured to receive a control signal that selectively controls an ADC dynamic range.

29. The transducer system of claim 1, wherein the clock input is configured to synchronize the control signal for input to the amplifier.

30. The transducer system of claim 1, wherein the transducer electronics die further comprises a converter configured to convert analog signals into digital signals or configured to convert digital signals into analog signals, the converter being in communication with the DSP and the amplifier, wherein the converter is configure to convert signals being communicated between the amplifier and the DSP.

31. The transducer system of claim 1, wherein the semiconductor die comprises a plurality of transducers.

32. The transducer system of claim 5, further comprising a second clock input, wherein each of the clock input and the second clock input are configured to either clock data output from the ADC or clock the control signal that selectively controls the gain of the amplifier.

33. A transducer system, comprising:
an integrated circuit carrier;
a transducer die having at least one transducer and mounted to the carrier, the transducer die being encapsulated within a package; and
a transducer electronics die separate from the transducer die, coupled to the at least one transducer, mounted to the carrier, and encapsulated within the package, the transducer electronics die comprising an amplifier in communication with the transducer and transducer electronics configured to provide a digital transducer interface comprising a serial data interface, a serial control interface, and a clock input, wherein the serial control interface is configured to receive a control signal for the amplifier,
wherein the serial data interface comprises a one bit serial data interface, and
wherein the transducer electronics die further comprises a register configured to convert the serial control signal received via the one bit serial control interface to parallel data having a bit width that corresponds to a bit width of an input of the amplifier.

* * * * *